United States Patent
Ross et al.

(10) Patent No.: US 6,426,127 B1
(45) Date of Patent: Jul. 30, 2002

(54) ELECTRON BEAM MODIFICATION OF PERHYDROSILAZANE SPIN-ON GLASS

(75) Inventors: Matthew Ross, La Jolla; Heike Thompson, San Diego, both of CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/473,374

(22) Filed: Dec. 28, 1999

(51) Int. Cl.$^7$ .................................................. C08J 7/04
(52) U.S. Cl. ........................ 427/503; 427/496; 427/497; 528/31; 528/38; 528/12; 528/21; 528/24; 522/5; 522/172; 428/447
(58) Field of Search ............................ 408/447; 528/31, 528/21, 24, 12, 38; 427/503, 496, 497; 522/5, 172

(56) References Cited

U.S. PATENT DOCUMENTS

| | | | | |
|---|---|---|---|---|
| 4,772,494 A | * | 9/1988 | Porte et al. ............... | 427/374.7 |
| 4,828,663 A | * | 5/1989 | Reedy, Jr. et al. ...... | 204/157.64 |
| 5,003,178 A | | 3/1991 | Livesay .................... | 250/492.3 |
| 5,032,649 A | * | 7/1991 | Schwark ..................... | 525/474 |
| 5,250,648 A | * | 10/1993 | Huggins ....................... | 528/21 |
| 5,386,006 A | * | 1/1995 | Matsumoto et al. ........... | 528/4 |
| 5,436,084 A | * | 7/1995 | Haluska et al. ............. | 428/688 |
| 5,922,411 A | | 7/1999 | Shimizu et al. .......... | 427/397.7 |
| 5,989,983 A | | 11/1999 | Goo et al. .................. | 438/472 |

* cited by examiner

*Primary Examiner*—Margaret G. Moore
(74) *Attorney, Agent, or Firm*—Roberts & Mercanti LLP

(57) ABSTRACT

The invention pertains to dielectric films for the production of microelectronic devices. A spin-on glass film is produced by depositing a silazane polymer containing composition film onto a substrate and then exposing the film to electron beam radiation. The electron beam exposing step is conducted by overall exposing the dielectric layer with a wide, large beam of electron beam radiation from a large-area electron beam source.

36 Claims, 5 Drawing Sheets

ELECTRON BEAM MODIFICATION OF PERHYDROSILAZANE SPIN-ON GLASS

BACKGROUND OF THE INVENTION

1. Field of the Invention

The invention pertains to dielectric films, more particularly the invention pertains to electron beam modification and curing of perhydrosilazane spin-on glass films which are useful for the production of microelectronic devices.

2. Description of the Related Art

The semiconductor industry is rapidly decreasing the dimensions and increasing the density of circuitry and electronic components in integrated circuits. In addition, integrated circuits are being layered or stacked with ever decreasing insulating layer thickness between each circuitry layer.

In the production of advanced integrated circuits that have minimum feature sizes of 0.25 micrometers and below, problems of interconnect RC delay, power consumption and crosstalk become significant. With these decreasing geometries and device sizes, the semiconductor industry has sought to avoid parasitic capacitance and crosstalk noise caused by inadequate insulating layers in the integrated circuits. One way to achieve the desired low RC delay constants involves use of dielectric material in insulating layers that have a low dielectric constant. The use of low dielectric constant (K) materials for interlevel dielectric and intermetal dielectric applications partially mitigate these problems. However, the material candidates which are used by the industry, having dielectric constants significantly lower than the currently employed dense silica, suffer from disadvantages. Most low dielectric constant materials developments use spin-on-glasses and fluorinated plasma chemical vapor deposition $SiO_2$ with K of greater than 3.

Silazane polymers, in particular, perhydrosilazane polymers are known as an insulator material on silicon-based integrated circuits. The formation of perhydrosilazane dielectric layers is known from U.S. Pat. No. 5,922,411. In this reference, a silazane-based polymer is converted into a ceramic material at a reduced temperature by reacting the silazane-based polymer with an amine compound, an acid compound or a peroxide ceramic-transformation promoting agent while in contact with a vapor of steam.

Previous approaches to depositing spin-on glass (SOG) materials such as silazane SOG materials perhydrosilazane polymer films have included a thermal cure of the material after coating to achieve the desired film properties. The draw back to thermal curing is that it requires relatively high temperatures and long curing times. The thermal cure is used to drive out the moisture in the film and provide some level of crosslinking of the material. Some SOG materials can be very sensitive to the process gas, or ambient, used during cure processing. This places additional requirements on the tools and processes used for thermal curing. For some materials the standard thermal cure temperatures (380 to 425° C.) and ambient atmospheres, such as nitrogen or argon, are not sufficient to fully cure the material. In these cases catalyst additives are included in the SOG material to help with the curing process. These catalysts add to the complexity of the material and may have an impact on the final film properties of the material. The additives can also increase the cost on manufacturing of the material. The perhydrosilazane polymers used for this invention may optionally contain a catalyst to aid in the curing of the material and make it less sensitive to the ambient used during curing. When a catalyst is not used, very precise control of the cure process is required to achieve the desired film properties.

For the integration of SOG materials into advanced integrated circuit devices there is a drive to reduce the total thermal budget required to process the materials for back-end interconnection. As device geometries are continually reduced, the demand for lower temperature processes increases. For materials that require high temperature thermal process, alternative methods for processing are needed. According to the present invention, an electron beam process is applied to a perhydrosilazane SOG material as a full or partial replacement to the thermal cure process. The electron beam process is more flexible than the thermal cure process in that the time, temperature and ambient atmosphere can be varied in ways that are not possible with the thermal cure process alone. The electron beam process is effective in removing the moisture from the film and a reduction in moisture is seen with increasing electron beam dose. The electron beam process can applied at temperatures substantially below the standard thermal cure process. With an electron beam processing at 200° C. and high enough dose, the moisture can be completely removed from the film. By contrast, a standard thermal cure requires a temperature of about 400° C. for 60 minutes to achieve the desired film properties. The electron beam process can be carried out in just a few minutes depending on the dose applied. The use of the electron beam process to cure the perhydrosilazane material addresses the issues of lowering the thermal budget of back processing for advanced IC devices. This includes both a reduction in the peak process temperature in addition to the total time at temperature.

SUMMARY OF THE INVENTION

The invention provides a process for forming a dielectric coating on a substrate which comprises a) applying a silazane polymer containing composition onto a substrate, b) optionally heating the composition to evaporate any solvents therefrom; and c) overall irradiating the composition with electron beam radiation under conditions sufficient to cure the silazane polymer containing composition.

The invention also provides a process for producing a microelectronic device which comprises a) applying a silazane polymer containing composition onto an insulating or semiconducting substrate, b) optionally heating the composition to evaporate any solvents therefrom; and c) overall irradiating the composition with electron beam radiation under conditions sufficient to cure the silazane polymer containing composition.

The invention further provides a microelectronic device which comprises an insulating or semiconducting substrate and an electron beam cured silazane polymer containing composition on the substrate.

The invention still further provides a process for curing a silazane polymer containing composition which comprises irradiating a silazane polymer containing composition to sufficient electron beam radiation to cure the silazane polymer containing composition.

The invention also provides a process for forming a dielectric coating on a substrate which comprises a) applying a silazane polymer containing composition onto a substrate, b) overall irradiating the composition with electron beam radiation under conditions sufficient to cure the silazane polymer containing composition.

The invention further provides a microelectronic device produced by a process which comprises
a) applying a silazane polymer containing composition onto an insulating or semiconducting substrate,
b) optionally heating the composition to evaporate any solvents therefrom; and
c) overall irradiating the composition with electron beam radiation under conditions sufficient to cure the silazane polymer containing composition.

DETAILED DESCRIPTION OF THE PREFERRED EMBODIMENT

Figure 1:
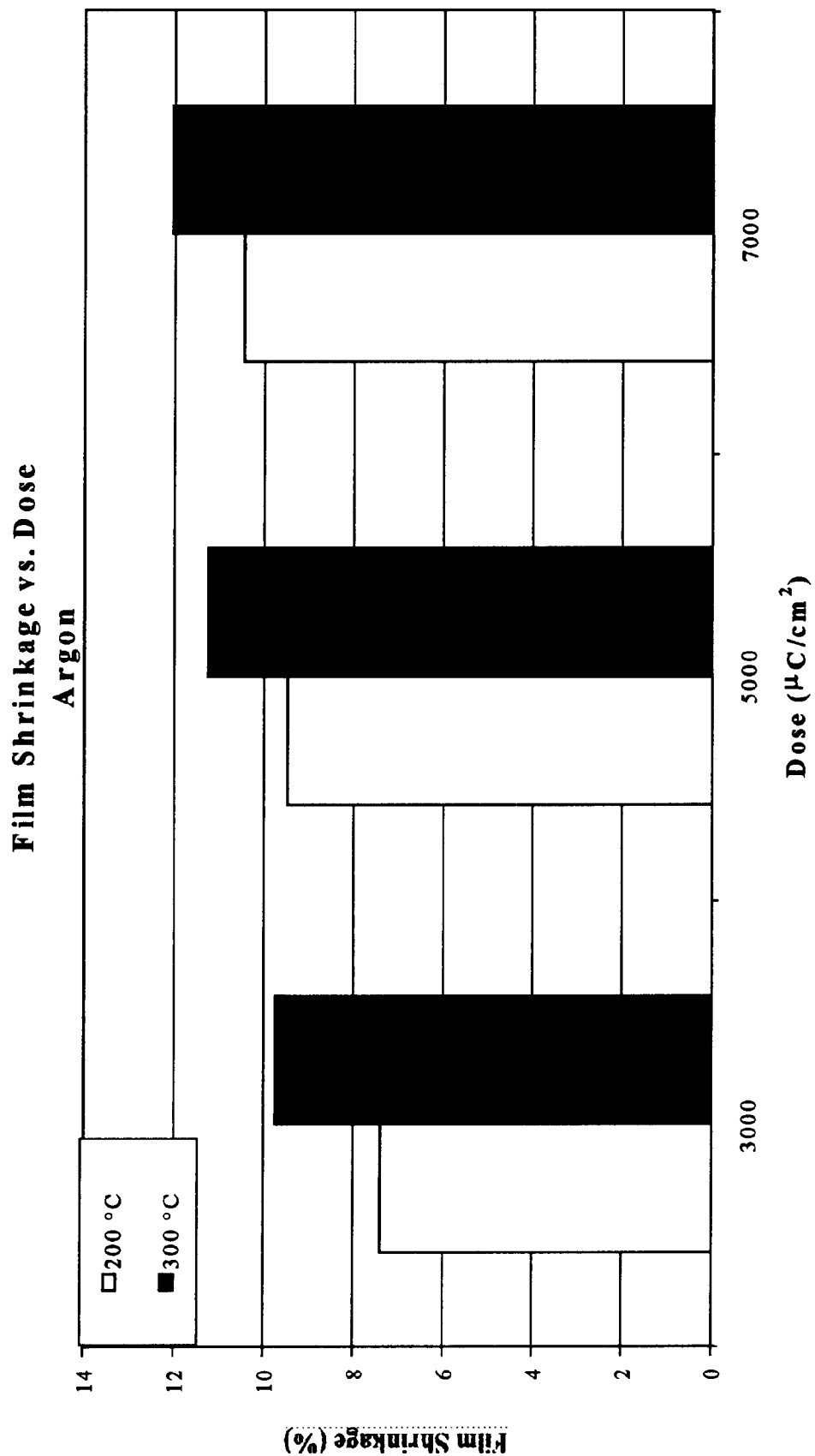
FIG. 1 shows a graph of film shrinkage vs. irradiation dose for a perhydrosilazane polymer SOG composition film.

As a first step in the process of the invention, a silazane polymer containing composition such as a perhydrosilazane spin-on glass, is deposited onto a substrate by any means known in the art.

Typical substrates are insulating or semiconducting substrates suitable to be processed into an integrated circuit or other microelectronic device. Suitable substrates for the present invention non-exclusively include silicon, aluminum, lithium niobate, polymeric resins, silicon dioxide, doped silicon dioxide, gallium arsenide, Group II/VN compounds, Group II/VI compounds, oxides, silicon nitride, titanium, titanium nitride, tantalum, tantalum nitride, copper, polysilicon, ceramics, aluminum/copper mixtures and combinations thereof.

On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

Silazane polymer containing compositions useful for this invention include silazane homopolymers, silazane containing copolymers, and polymetallosilazane which are capable of being transformed into a ceramic material. When cured, such polymers are transformed into a ceramic material composed substantially of silicon dioxide and/or silicon nitride. Preferably the silazane polymer is a perhydrosilazane polymer, such as those available commercially from Tonen Corporation of Japan. The silazane-based polymers used in the present invention include silazane polymers containing structural units having the formula

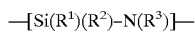

—[Si($R^1$)($R^2$)-N($R^3$)]— wherein $R^1$, $R^2$ and $R^3$ are hydrogen or an organic group with the proviso that at least one of $R^1$, $R^2$ and $R^3$ is hydrogen. The organic groups may include not only those organic groups having carbon atoms directly bonded to the silicon atom (Si) or the nitrogen atom (N) but also those organic groups having hetero-atoms directly bonded to the silicon atom (Si) or the nitrogen atom N). Examples of the hetero-atoms are a silicon atom, a nitrogen atom, an oxygen atom, a sulfur atom or the like. Specific examples of the suitable organic groups are those wherein $R^1$, $R^2$ and $R^3$ are independently substituted or unsubstituted. They may be hydrocarbon groups such as an alkyl group, an alkoxy group, an alkenyl group, a cycloalkyl group, an aryl group or an aralkyl group; silyl groups having hydrocarbon groups, such as an alkylsilyl group or an arylsilyl group; amino groups having hydrocarbon groups, such as an alkylamino group or an arylamino group; hydrocarbon-oxy groups such as an alkoxy group, an aryloxy group or an aralkyloxy group, or the like. These hydrocarbon groups have 1 to 18 carbon atoms, preferably 1 to 12 carbon atoms, more preferably 1 to 8 carbon atoms. Further, the hydrocarbon groups may have substituent groups. Examples of the suitable substituent groups include a halogen atom, an alkoxy group, an amino group, a carboxyl group, a hydroxyl group, an alkoxycarbonyl group, a nitro group or the like. Most preferably each of $R^1$, $R^2$ and $R^3$ are hydrogen. In the present invention, as the silazane-based polymers, there can be used not only ordinary polysilazanes but also various modified polysilazanes such as polymetallosilazanes or silazane copolymers. Further, the silazane-based polymers may be those having a chain structure, a cyclic structure or both the structures. Furthermore, the silazane-based polymers may have a crosslinked structure in a molecule thereof The silazane polymer has a number average molecular weight in the range of from about 90 to about 50,000 preferably 200 to 10,000. The silazane-based polymers of the present invention can be used singly or in the form of a mixture of any two or more thereof Further, the silazane-based polymers of the present invention can be used in the form of a mixture of the silazane-based polymer and other kinds of polymers. The silazane polymer containing compositions useful for the invention are more fully described in U.S. Pat. No. 5,922, 411 which is incorporated herein by reference.

The silazane polymer containing compositions may also contain a catalyst such an amine compound, an acid compound, a peroxide and combinations thereof. Examples of suitable amines include methyl amine, dimethyl amine, trimethyl amine, ethyl amine, diethyl amine, triethyl amine, propyl amine, dipropyl amine, tripropyl amine, butyl amine, dibutyl amine, tributyl amine, pentyl amine, dipentyl amine, tripentyl amine, hexyl amine, dihexyl amine, trihexyl amine, heptyl amine, diheptyl amine, octyl amine, dioctyl amine, trioctyl amine, phenyl amine, diphenyl amine, triphenyl amine or-the like. The acid compounds may be organic and inorganic acids. Examples of the organic acids may include carboxylic acids, sulfonic acids or the like. Examples of these organic acids include acetic acid, propionic acid, butylic acid, valeric acid, maleic acid, ethane-sulfonic acid or the like. Examples of the inorganic acids may include hydrochloric acid, nitric acid, phosphoric acid, chloric acid, hypochlorous acid, sulfuric acid or the like. Examples of the peroxides may include hydrogen peroxide, sodium peroxide, calcium peroxide, hydrogen peroxide adducts, peroxo acid, peroxo acid salts or the like. Any of the afore-mentioned amine compounds, acid compounds and peroxides can be used singly or in the form of a mixture of any two or more thereof The catalyst may be present in an amount of not less than I ppm by weight, preferably in the range of 10 ppm by weight to 100% by weight, more preferably in the range of 100 ppm by weight to 50% by weight, based on the weight of the polymer.

The polymer is dispersed in a suitable compatible solvent and applied onto a substrate. Suitable solvent compositions include those which have a boiling point of about 120° C. or less, preferably about 100° C. or less. Suitable high volatility solvent composition nonexclusively include methanol, ethanol, n-propanol, isopropanol, n-butanol and mixtures thereof. Other relatively high volatility solvent compositions which are compatible with the other ingredients can be readily determined by those skilled in the art. The solvent is preferably present in an amount of from about 1% to about 99% by weight of the overall blend, more preferably from about 15% to about 80% and most preferably from about 40% to about 60% by weight of the overall blend with the polymer.

The composition may be applied to the substrates via conventional spin-coating, dip coating, spraying, or meniscus coating-methods which are well-known in the art. Spin coating is most preferred. The thickness of the dielectric film on the substrate may vary depending on the amount of liquid dielectric that is applied to the substrate, but typically the thickness may range from about 500 Å to about 50,000 Å, and preferably from about 2000 Å to about 12000 Å. The amount of dielectric liquid applied to the substrate may vary from about 1 ml to about 10 ml, and preferably from about 2 ml to about 8 ml. In the preferred embodiment, the liquid material is spun onto the upper surface the substrate according to known spin techniques. Preferably, the composition is applied from a solution which is centrally applied to the substrate and then spun on a rotating wheel at speeds ranging between about 500 and about 6000 rpm, preferably from about 1500 to about 4000 rpm, for about 5 to about 60 seconds, preferably from about 10 to about 30 seconds, in order to spread the solution evenly across the substrate surface. The dielectric layer preferably has a density of from about 1 g/cm$^3$ to about 3 g/cm$^3$.

In an optional but preferred step, the treated wafer substrate is then heated for a time and at a temperature sufficient to evaporate the solvents from the film. This may be conducted, for example by a hot plate heat treatment at a temperature of from about 50° C. to about 500° C., preferably from about 100° C. to about 400° C. for about 10 seconds to about 5 minutes, preferably for from about 30 seconds to about 2 minutes. This is preferably done on a hot plate but may also be done in an oven. The heat treatment of the film partially crosslinks and solidifies and partially planarizes the layer. After the coating is heated, the thickness of the resulting film ranges from about 500 Å to about 50,000 Å, preferably from about 500 Å to about 20,000 Å, and most preferably from about 1,000 Å to about 12,000 Å.

The film is then treated by exposing it to a flux of electrons. Such a treatment is performed by placing the coated substrate inside the chamber of a large area electron beam exposure system, such as that described in U.S. Pat. No. 5,003,178 to Livesay, the disclosure of which is incorporated herein by reference. Such an apparatus is available commercially as an ElectronCure™ tool made by the Electron Vision Group of Honeywell International Inc. This apparatus overall exposes the entire film to a flood electron beam flux all at once with a uniform, large-area, overall electron beam exposure source which simultaneously exposes substantially all of the silazane polymer containing composition simultaneously. The period of electron beam exposure will be dependent on the total dosage applied, the electron beam energy applied to the film and the beam current density. One of ordinary skill in the art can readily optimize the conditions of exposure. Preferably the electron beam exposure is done at a vacuum in the range of from about $10^{-5}$ to about $10^2$ torr, and with a substrate temperature in the range of from about 10° C. to about 1000° C. more preferably from about 100° C. to about 400° C. The electron beam energy will fall into the range of from about 0.5 to about 100 KeV, preferably from about 0.5 to about 20 KeV and more preferably from about 1 to about 8 KeV. The electron beam exposing is preferably conducted from a source which generates an electron beam current of from about 0.1 to about 150 mA more preferably, from about 1.0 mA to about 30 mA. The electron beam dose will fall into the range of from about 1 to about 500,000 $\mu C/cm^2$, preferably from about 100 to about 10,000 $\mu C/cm^2$. The dose and energy selected will be proportional to the thickness of the film to be processed. The appropriate doses and energies may easily be determined by those skilled in the art for the case at hand. Generally the exposure will range from about 0.5 minute to about 120 minutes, and preferably from about 1 minute to about 60 minutes. The film coated substrate may be exposed to electron beams in any chamber having a means for providing electron beam radiation to substrates placed therein. The film is preferably subjected to an electron beam radiation from a uniform large-area electron beam source under conditions sufficient to stabilize the full width and full thickness of the perhydrosilazane film. Preferably the exposure is conducted with an electron beam which covers an area of from about 4 square inches to about 256 square inches. The gaseous ambient in the electron beam system chamber may be nitrogen, oxygen, hydrogen, argon, xenon, helium, methane, silane, forming gas which is a blend of hydrogen and nitrogen, ammonia and mixtures thereof.

As an optional step, the film may be heated at a temperature in the range of about 50° C. to about 500° C. over a period in the range of about 1 to about 360 minutes causing a further crosslinking and densification of the surface. One may thereafter optionally deposit an oxide on the cured silazane polymer composition in a subsequent step by chemical vapor deposition.

The cured silazane polymer composition layer may then be patterned and etched to form vias through the layer. This step is done using standard lithographic techniques well known to the skilled artisan. Then trenches are likewise formed in the layer by lithographic patterning and etching. The vias and trenches are then deposited with a barrier metal layer, a seed metal and then plated with copper. The copper layer is then polished back to the film by a chemical mechanical polishing treatment.

Vias and trenches are formed in the dielectric layer by well known photolithographic techniques using a photoresist composition. Such are formed in a manner well known in the art such as by coating the top of the cured silazane polymer composition layer with a photoresist, imagewise exposing to actinic radiation such as through a suitable mask, developing the photoresist and etching away portions of the layer. The photoresist composition may be positive working or negative working and are generally commercially available. Suitable positive working photoresists are well known in the art and may comprise an o-quinone diazide radiation sensitizer. The o-quinone diazide sensitizers include the o-quinone4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the cured silazane polymer composition layer and the inside walls of the vias by plasma etching. Plasma generators which are capable of are described in U.S. Pat. Nos. 5,174,856 and 5,200,031. Trenches may optionally be formed in the same manner.

Next the vias and optional trenches are filled with a conductive metal which fills the vias and trenches on top of the cured silazane polymer composition layer. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation and the like. The thickness of the metal layers is preferably from about 3000 to 5000 Angstroms. Typically the metal is applied by first forming a barrier metal and seeding layer on the walls of the vias and the cured silazane polymer composition layer. Then the balance of the metal is applied. The barrier metal serves to prevent diffusion of the conductive metal into the dielectric layers. Barrier metal may be, for example, a nitride such TaN or TiN. Next the metal layer is removed back to the cured silazane polymer composition layer by chemical mechanical polishing or an etch back by techniques which are well known in the art. The cured silazane polymer composition layer acts as a polish stop for the resulting microelectronic device.

The following non-limiting examples serve to illustrate the invention.

EXAMPLE 1

Synthesis of Perhydropolysilazane

A four-necked flask having a capacity of one liter is equipped with a gas feed pipe, a mechanical stirrer and a Dewar condenser. After an interior of the four-necked flask as a reactor is replaced with a deoxygenated dry nitrogen gas, 490 ml of deoxygenated dry pyridine is charged into the flask and the content in the flask is cooled with ice. Successively, when 51.9 g of dichlorosilane is added to the mixture in the flask, a white solid adduct is produced. The resultant reaction mixture is cooled with ice and 51.0 g of purified ammonia is blown into the flask through a sodium hydroxide pipe and an active carbon pipe while stirring. Thereafter, the mixture in the flask is heated at 100° C. After completion of the reaction, the reaction mixture is removed by centrifugal separation and washed with dry pyridine. Further, the reaction mixture is filtered in a dry nitrogen atmosphere so that 850 ml of a filtrate is obtained. 5 ml of the filtrate is placed under a reduced pressure to remove a solvent therefrom, so that 0.102 g of resinous solid perhydropolysilazane is obtained. The thus-obtained polymer has a number-average molecular weight of 1,120 when measured according to a cryoscopy (solvent: dry benzene). Also, the infra-red absorption spectrogram of the polymer (solvent: dry o-xylene; concentration of perhydropolysilazane: 10.2 g/l) reveals that the absorptions occur at a wave-number of 3390 and 1180 based on N—H, at a wave-number of 2170 based on Si—H and at wave-number of 1040 to 800 based on Si—N—Si, respectively.

EXAMPLE 2

A set of 200 mm silicon wafers are prepared by spin coating perhydrosilazane spin on glass (SOG) on a DNS spin coat track. The 3–5 ml of the SOG material was dispensed on the wafer and the spin process was 20 seconds at 3000 rpm. The wafers were then baked at 80° C., 150° C., and 250° C. for 60 seconds. Edge bead removal (EBR) and back side rinse (BSR) were applied to all the wafers immediately after spin coating. One wafer from the group was cured using a standard thermal cure process in a Cosmos furnace at 400° C. under a nitrogen ($N_2$) ambient atmosphere. This wafer was included as the thermal reference.

The remaining wafers were then subjected to an electron beam irradiation treatment in the ElectronCure tool made by the Electron Vision Group of Honeywell International Inc. A uniform dose distribution recipe was employed and the dose range included 3000 $\mu C/cm^2$, 5000 $\mu C/cm^2$, and 7,000 $\mu C/cm^2$. The uniform dose distribution is listed below. Argon, nitrogen, and oxygen were used as the process gases during the electron beam process. The processing was carried out at 200° C. and 300°0 C. in the electron beam process chamber.

Uniform Dose/Depth Process

| | Uniform Dose/Depth Process | | | |
|---|---|---|---|---|
| | | Total Dose ($\mu C/cm^2$) | | |
| Step | keV | 3000 | 5000 | 7000 |
| 1 | 5.2 | 1950 | 3250 | 4550 |
| 2 | 3 | 450 | 750 | 1050 |
| 3 | 3 | 300 | 500 | 700 |
| 4 | 3 | 300 | 500 | 700 |

The SOG films were measured before and after processing for film thickness, index of refraction, and FTIR. The film thickness and index of refraction were measured using a J. A. Woollam M88 spectroscopic ellipsometer. The FTIR spectra were collected using a Nicolet Magna IR 760 system. Film shrinkage and refractive index changes were monitored as well as chemical changes via the FTIR spectra.

Figure 2:
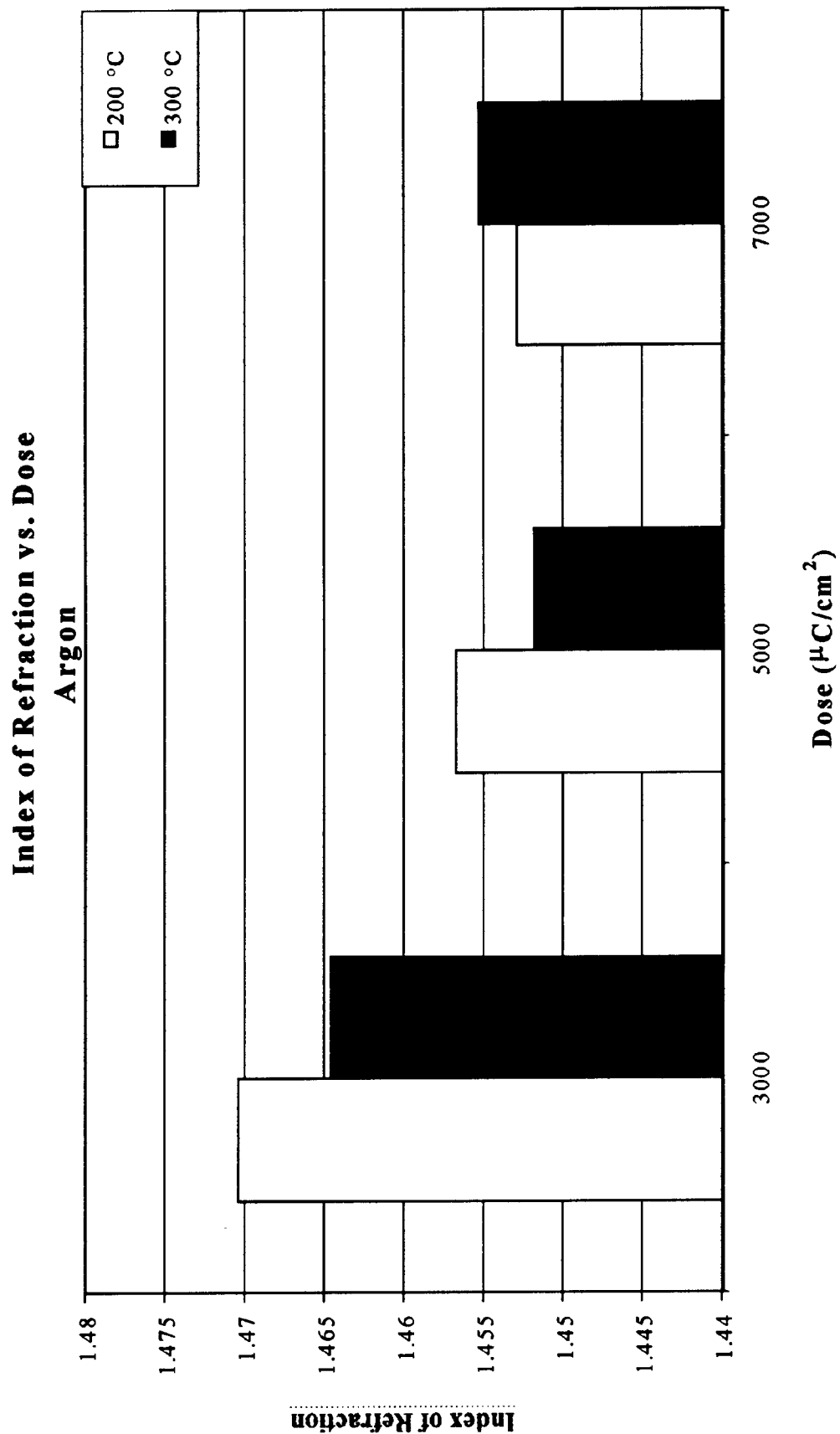
FIG. 2 shows a graph of index of refraction vs. irradiation dose for a perhydrosilazane polymer SOG composition film.

The film shrinkage was found to increase with increasing dose and temperature. The film shrinkage using argon gas is shown in FIG. 1. The film shrinkage for the argon process gas case increases from about 8% to about 11% with the increase in dose. This is compared to the thermal cure value of approximately 10%. Thus, the electron beam process modifies the material such that the shrinkage is comparable to the thermal cure process. The index of refraction was also found to change with the electron beam process. The change in index of refraction is shown in FIG. 2 for the argon process gas case. The index is found to decrease with increasing dose level. This is compared to the thermal cure value of 1.48. A reduction in the index of refraction leads to a reduction in the dielectric constant with the electron beam process as compared to the thermal cure process. Thus, a dielectric constant value below that of the thermal cure may be achieved with the electron beam process.

Figure 3:
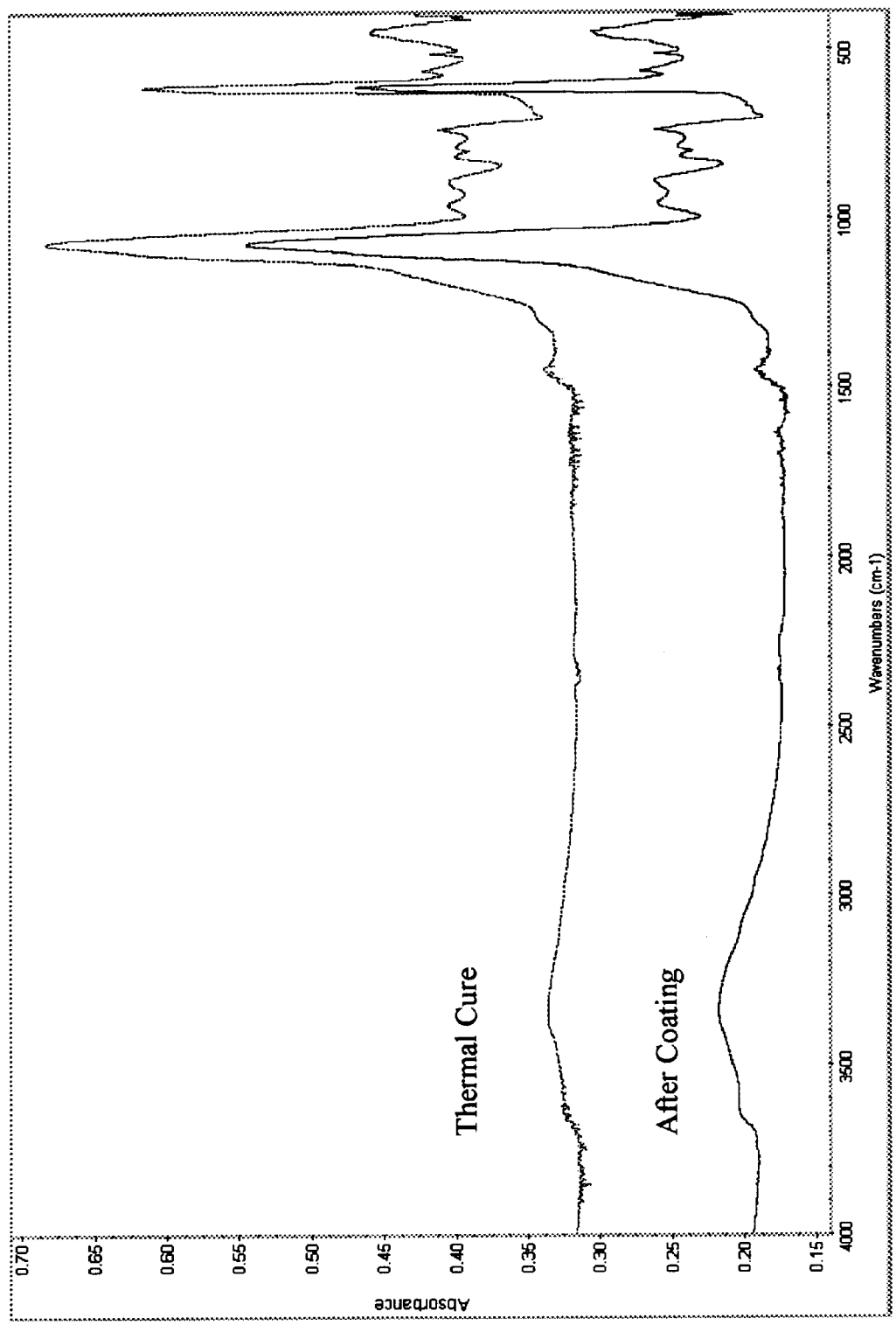
FIG. 3 shows an FTIR spectra of a perhydrosilazane polymer SOG composition film after coating and a thermal cure at 400° C. in nitrogen as control.

The measure of the effectiveness of the cure process for most SOG materials is the removal of the moisture and solvent from the coated film. This may be accomplished by monitoring the moisture content via FTIR analysis. The moisture shows as a broad peak between 3500 cm$^{-1}$ and 3200 cm$^{-1}$. FIG. 3 shows the SOG material after coating and after a standard thermal cure process as a control. The film shows some moisture after the coating and softbake process which is then reduced by the thermal cure process. It should be noted that it does not appear that the thermal cure process totally removed the moisture from the SOG film.

Figure 4:
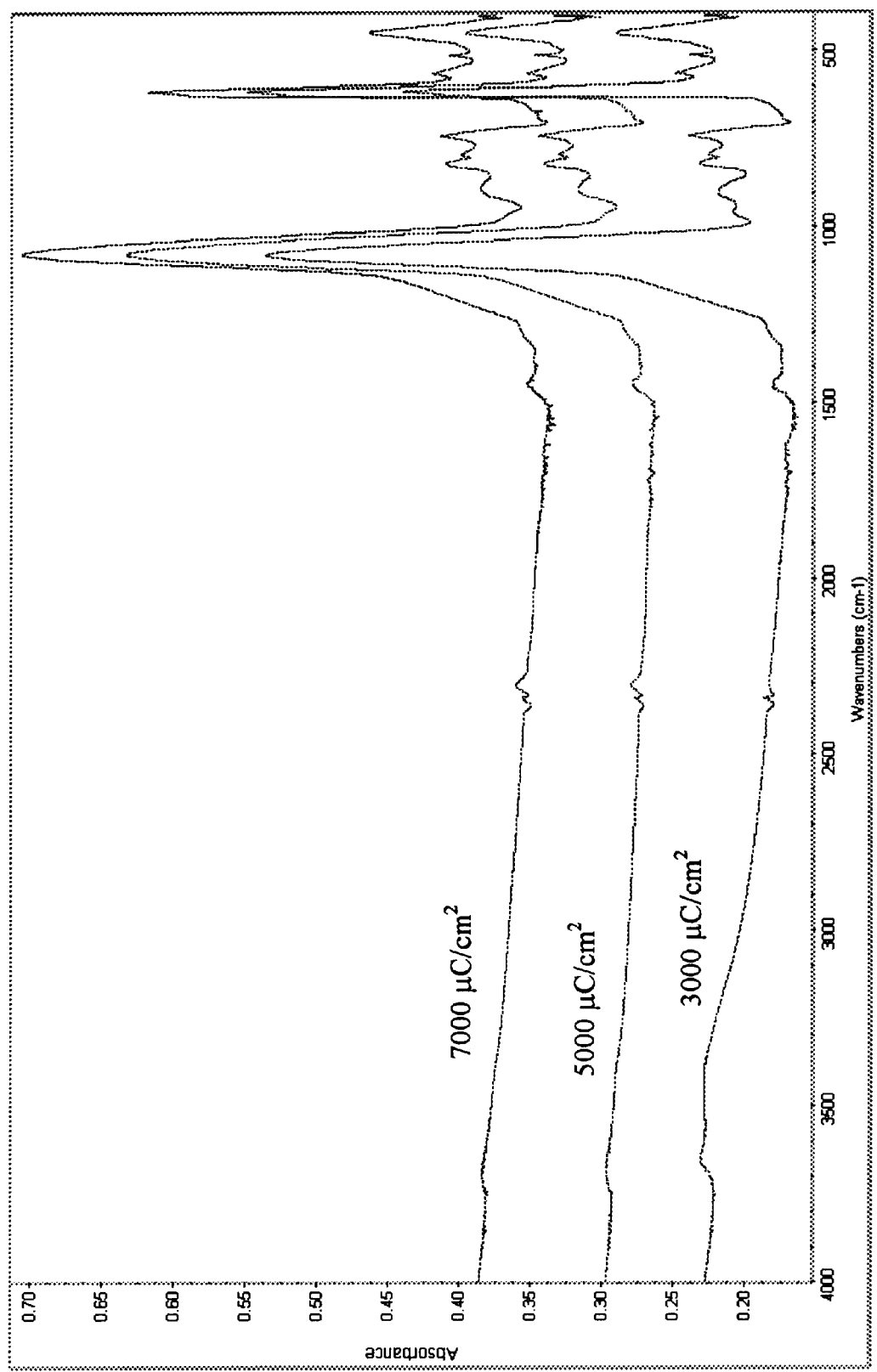
FIG. 4 shows a FTIR spectra of a perhydrosilazane polymer SOG composition film after coating and electron beam irradiation processing at 200° C. in argon.
Figure 5:
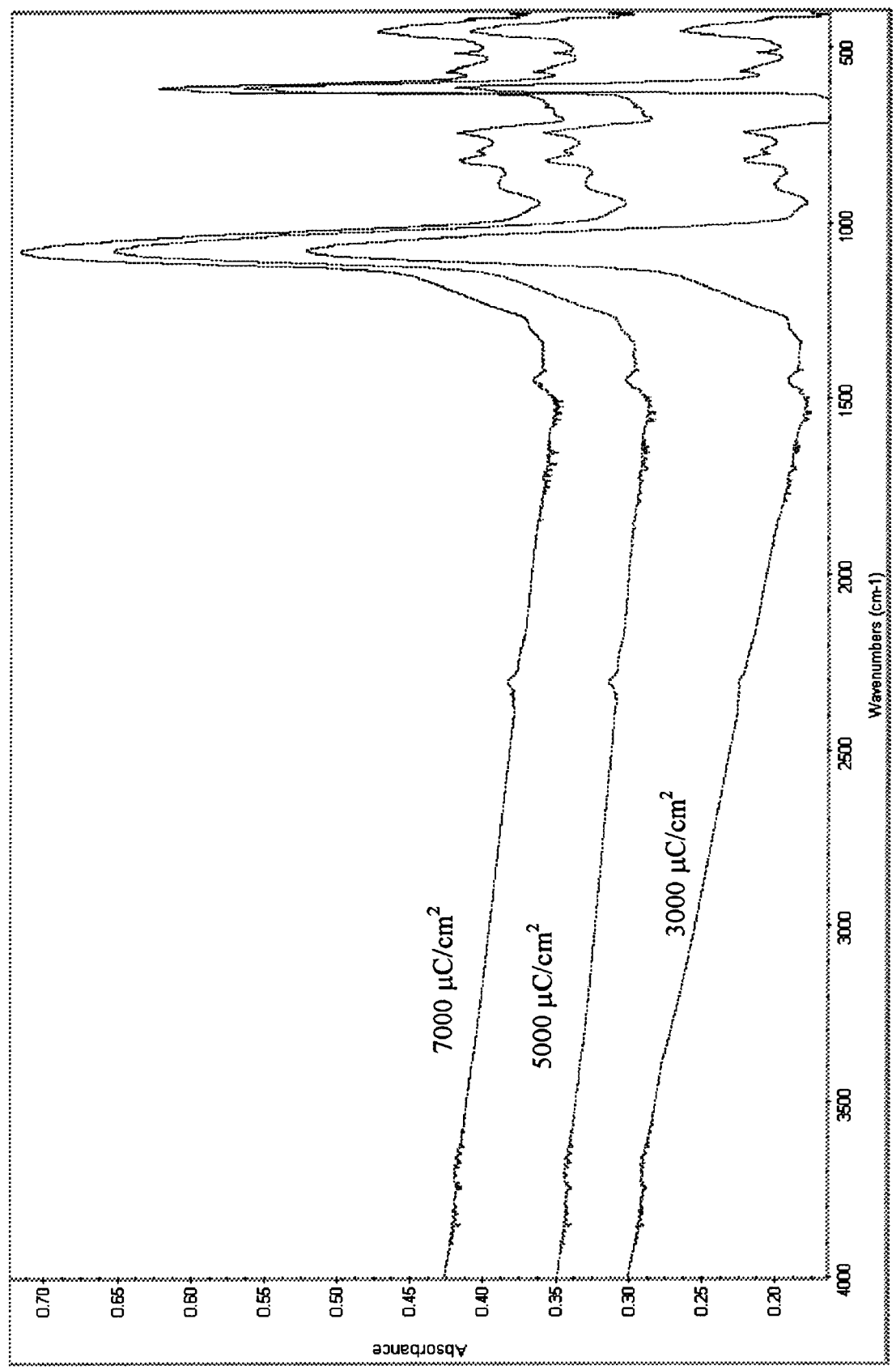
FIG. 5 shows a FTIR spectra of a perhydrosilazane polymer SOG composition film after coating and electron beam irradiation processing at 300° C. in argon.

FIGS. 4 and 5 show the FTIR spectra of the SOG material after electron beam processing with 3000 μC/cm$^2$, 5000 μC/cm$^2$, and 7000 μC/cm$^2$ at 200 ° C. and 300° C. respectively. As can be seen in FIG. 4, the moisture in the film is reduced with increasing dose. By increasing the process temperature to 300° C. the moisture is removed at a lower dose level. Thus, a lower dose can be used at a higher temperature.

Comparing FIGS. 4 and 5 with FIG. 3, it can be seen that there is a significant reduction in the moisture content in the SOG films with the electron beam process over the thermal cure process. Thus, the electron beam process appears to offer a more effective means of curing the perhydrosilazane SOG material.

Due to the different responses of the perhyodrosilazane material to the electron beam process under different process gas ambients, it is expected that the nature of the material can be modified according to the process gas selected. It is believed that in the current case, curing the SOG material under oxygen yields a different film as compared to using argon or nitrogen as the process gas. It is suggested that the formation of films similar to silicon oxynitride may be possible with the proper selection of process gas and electron beam process conditions. The differences in index of refraction also suggest that there is some difference in the dielectric properties of the SOG material after electron beam processing in the different process gases considered. This would allow for the tailoring of the perhyodrosilazane materials properties by the appropriate selection of the electron beam process conditions.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for forming a dielectric coating on a substrate which comprises
   a) applying a silazane polymer containing composition onto a substrate,
   b) optionally heating the composition to evaporate any solvents therefrom; and
   c) overall irradiating the composition with electron beam radiation under conditions sufficient to cure the silazane polymer containing composition, wherein the electron beam irradiating is conducted with a uniform, large-area, overall electron beam exposure source which simultaneously exposes substantially all of the silazane polymer containing composition simultaneously.

2. The process of claim 1 wherein the silazane polymer has contains structural units having the formula

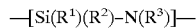

wherein R$^1$, R$^2$ and R$^3$ are hydrogen or an organic group with the proviso that at least one of R$^1$, R$^2$ and R$^3$ is hydrogen.

3. The process of claim 2 wherein R$^1$, R$^2$ and R$^3$ are independently a substituted or unsubstituted alkyl group, alkenyl group, cycloalkyl group, aryl group, aralkyl group, alkoxy group, silyl group having a hydrocarbon group, amino group having a hydrocarbon group, hydrocarbon-oxy group, aryloxy group or aralkyloxy group, which may have from 1 to about 18 carbon atoms.

4. The process of claim 3 wherein the substituent groups are selected from the group consisting of a halogen atom, an alkoxy group, an amino group, a carboxyl group, a nitrile group, a hydroxyl group, an alkoxycarbonyl group and a nitro group.

5. The process of claim 2 wherein each of R$^1$, R$^2$ and R$^3$ are hydrogen.

6. The process of claim 1 wherein the silazane polymer has a number average molecular weight in the range of from about 90 to about 50,000.

7. The process of claim 1 wherein the silazane polymer is a homopolymer.

8. The process of claim 1 wherein the silazane polymer is a silazane containing copolymer.

9. The process of claim 1 wherein the silazane polymer is a polymetallosilazane.

10. The process of claim 1 wherein the silazane polymer is a perhydrosilazane polymer.

11. The process of claim 1 wherein the silazane polymer containing composition comprises a catalyst.

12. The process of claim 1 wherein the silazane polymer containing composition comprises a catalyst selected from the group consisting of an amine compound, an acid compound, a peroxide and combinations thereof.

13. The process of claim 1 wherein the silazane polymer is a perhydrosilazane polymer having a number average molecular weight in the range of from about 200 to about 50,000.

14. The process of claim 1 wherein the substrate is selected from the group consisting of silicon, aluminum, lithium niobate, polymeric resins, silicon dioxide, doped silicon dioxide, gallium arsenide, Group III/V compounds, Group II/VI compounds, oxides, silicon nitride, titanium, titanium nitride, tantalum, tantalum nitride, copper, polysilicon, ceramics, aluminum/copper mixtures and combinations thereof.

15. The process of claim 1 wherein the heating step (b) is conducted at a temperature of from about 50° C. to about 500° C.

16. The process of claim 1 wherein the heating step (b) is conducted at a temperature of from about 100° C. to about 400° C.

17. The process of claim 1 wherein each electron beam irradiating is conducted with a source which generates an electron beam energy level ranging from about 0.5 to about 100 KeV.

18. The process of claim 1 wherein each electron beam irradiating is conducted with a source which generates an electron beam energy level ranging from about 0.5 to about 20 KeV.

19. The process of claim 1 wherein each electron beam irradiating is from a source which generates an electron dose ranging from about 1 to about 500,000 μC/cm$^2$.

20. The process of claim 1 wherein each electron beam irradiating is from a source which generates an electron dose ranging from about 100 to about 10,000 $\mu C/cm^2$.

21. The process of claim 1 wherein each electron beam irradiating is conducted from a source which generates an electron beam current of from about 0.1 to about 150 mA.

22. The process of claim 1 wherein each electron beam irradiating is conducted while heating the substrate to a temperature of from about 10° C. to about 1,000° C.

23. The process of claim 1 wherein each electron beam irradiating is conducted in a gas selected from the group consisting of nitrogen, oxygen, hydrogen, argon, xenon, helium, methane, silane, a blend of hydrogen and nitrogen, ammonia and mixtures thereof.

24. The process of claim 1 wherein each electron beam irradiating is conducted while the substrate is under a vacuum maintained in the range of from about $10^{-5}$ to about 102 torr.

25. A process for forming a dielectric coating on a substrate which comprises
a) applying a silazane polymer containing composition onto a substrate,
b) optionally heating the composition to evaporate any solvents therefrom; and
c) overall irradiating the composition with electron beam radiation under conditions sufficient to cure the silazane polymer containing composition, wherein each electron beam irradiating is conducted with a uniform large-area electron beam source which covers an exposure area of from about 4 square inches to about 256 square inches simultaneously.

26. A process for forming a dielectric coating on a substrate which comprises
a) applying a silazane polymer containing composition onto a substrate,
b) optionally heating the composition to evaporate any solvents therefrom; and
c) overall irradiating the composition with electron beam radiation under conditions sufficient to cure the silazane polymer containing composition, wherein each electron beam irradiating is conducted while heating the substrate to a temperature of from about 100° C. to about 400° C.

27. A process for forming a dielectric coating on a substrate which comprises
a) applying a silazane polymer containing composition onto a substrate,
b) optionally heating the composition to evaporate any solvents therefrom; and
c) overall irradiating the composition with electron beam radiation under conditions sufficient to cure the silazane polymer containing composition; and
d) heating the silazane polymer containing composition at a temperature of from about 50° C. to about 500° C.

28. A process for producing a microelectronic device which comprises
a) applying a silazane polymer containing composition onto an insulating or semiconducting substrate,
b) optionally heating the composition to evaporate any solvents therefrom; and
c) overall irradiating the composition with electron beam radiation under conditions sufficient to cure the silazane polymer containing composition; and
d) applying a chemical vapor deposited oxide film on the cured silazane polymer containing composition.

29. The process of claim 28 wherein the silazane polymer has contains structural units having the formula

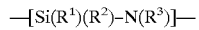

wherein $R^1$, $R^2$ and $R^3$ are hydrogen or an organic group with the proviso that at least one of $R^1$, $R^2$ and $R^3$ is hydrogen.

30. A process for producing a microelectronic device which comprises
a) applying a silazane polymer containing composition onto an insulating or semiconducting substrate,
b) optionally heating the composition to evaporate any solvents therefrom; and
c) overall irradiating the composition with electron beam radiation under conditions sufficient to cure the silazane polymer containing composition; and
d) forming vias in the cured silazane polymer containing composition.

31. The process of claim 30 further comprising the step of filling the vias with a metal.

32. A process for producing a microelectronic device which comprises
a) applying a silazane polymer containing composition onto an insulating or semiconducting substrate, wherein the silazane polymer containing composition comprises a perhydrosilazane polymer;
b) optionally heating the composition to evaporate any solvents therefrom; and
c) overall irradiating the composition with electron beam radiation under conditions sufficient to cure the silazane polymer containing composition.

33. A process for curing a silazane polymer containing composition which comprises
a) applying a silazane polymer containing composition onto a substrate,
b) optionally heating the composition to evaporate any solvents therefrom; and
c) overall irradiating the composition with electron beam radiation under conditions sufficient to cure the silazane polymer containing composition, wherein the electron beam irradiating is conducted with a uniform, large-area, overall electron beam exposure source which simultaneously exposes substantially all of the silazane polymer containing composition simultaneously.

34. The process of claim 33 wherein the silazane polymer has contains structural units having the formula

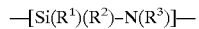

wherein $R^1$, $R^2$ and $R^3$ are hydrogen or an organic group with the proviso that at least one of $R^1$, $R^2$ and $R^3$ is hydrogen.

35. The process of claim 33 wherein the silazane polymer is a perhydrosilazane polymer.

36. A process for forming a dielectric coating on a substrate which comprises
a) applying a silazane polymer containing composition onto a substrate, and
b) overall irradiating the composition with electron beam radiation under conditions sufficient to cure the silazane polymer containing composition, wherein the electron beam irradiating is conducted with a uniform, large-area, overall electron beam exposure source which simultaneously exposes substantially all of the silazane polymer containing composition simultaneously.

* * * * *